(12) United States Patent
Tsuji et al.

(10) Patent No.: US 8,941,102 B2
(45) Date of Patent: Jan. 27, 2015

(54) ORGANIC ELECTROLUMINESCENT ELEMENT

(75) Inventors: Hiroya Tsuji, Kyoto (JP); Kenichiro Watanabe, Osaka (JP); Nobuhiro Ide, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/006,421

(22) PCT Filed: Mar. 12, 2012

(86) PCT No.: PCT/JP2012/056227
§ 371 (c)(1),
(2), (4) Date: Sep. 20, 2013

(87) PCT Pub. No.: WO2012/128090
PCT Pub. Date: Sep. 27, 2012

(65) Prior Publication Data
US 2014/0008630 A1 Jan. 9, 2014

(30) Foreign Application Priority Data
Mar. 24, 2011 (JP) ................................. 2011-066569

(51) Int. Cl.
*H01L 29/08* (2006.01)
*H01L 35/24* (2006.01)
(Continued)

(52) U.S. Cl.
CPC ........ *H01L 51/5036* (2013.01); *H01L 51/5044* (2013.01)
USPC .............................................. 257/40; 257/89

(58) Field of Classification Search
CPC ............ H01L 27/3209; H01L 51/5044; H01L 51/504; H01L 51/5036
USPC ................... 257/88, 89, 102, E51.022, 40, 79
See application file for complete search history.

(56) References Cited

U.S. PATENT DOCUMENTS

| 2010/0295445 A1 | 11/2010 | Kuma et al. |
| 2010/0301319 A1 | 12/2010 | Kuma et al. |
| 2012/0248424 A1 | 10/2012 | Sasaki |

FOREIGN PATENT DOCUMENTS

| JP | 2011-070963 | 4/2011 |
| WO | 2009/008347 | 1/2009 |

(Continued)

OTHER PUBLICATIONS

U.S. Appl. No. 13/981,445 to Kazuyuki Yamae, filed Jul. 24, 2013.
(Continued)

*Primary Examiner* — Colleen A Matthews
*Assistant Examiner* — Quovaunda V Jefferson
(74) *Attorney, Agent, or Firm* — Greenblum & Bernstein P.L.C.

(57) ABSTRACT

The organic electroluminescent element which is designed to emit white light in a range of a low color temperature to a high color temperature that is important for an illumination light source with a minor design change, and, moreover, has high color rendering property especially in an average color rendering index Ra and a special color rendering index R9 for red, while being highly efficient and long-life is obtained. The organic electroluminescent element includes: a transparent electrode; a first light-emitting unit including blue and green fluorescent light-emitting layers; an intermediate layer; a second light-emitting unit including red and green phosphorescent light-emitting layers; and a reflecting electrode. The first and second light-emitting units are stacked and the intermediate layer is interposed therebetween. The first light-emitting unit is designed to emit light by use of a phenomenon that a singlet exciton is generated by collision and fusion of two triplet excitons.

6 Claims, 5 Drawing Sheets

(51) Int. Cl.
*H01L 51/00* (2006.01)
*H01L 51/50* (2006.01)

(56) References Cited

FOREIGN PATENT DOCUMENTS

| WO | 2010/134352 | 11/2010 |
| WO | 2011/037209 | 3/2011 |
| WO | 2012/053216 | 4/2012 |

OTHER PUBLICATIONS

U.S. Appl. No. 14/000,531 to Takeo Shirai et al., filed Aug. 20, 2013.
International Search Report (ISR) and Written Opinion in International Application No. PCT/JP2012/056227, dated Jun. 19, 2012.
Nobuhiro Ide et al., "High-Performance OLEDs and Their Application to Lighting", Proc. of SPIE, vol. 7051, pp. 705119-1-705119-10 (2008).

Maximum emission wavelength of
blue emission spectrum (nm)

Maximum emission wavelength of
red emission spectrum (nm)

ORGANIC ELECTROLUMINESCENT ELEMENT

TECHNICAL FIELD

The present invention relates to an organic electroluminescent element.

BACKGROUND ART

Organic electroluminescent elements have attracted attention as a next-generation illumination light source because they are thin and enable planar light-emission, and have been vigorously developed with the aim of practical use. In particular, research and development has been actively conducted especially with regard to technologies for improving color rendering properties, which is regarded as one of problems with inorganic LED lighting, and methods for improving color rendering properties by various design and technological developments of devices have been proposed. However, problems remain in order to realize sufficient improvement in color rendering properties in comparison with conventional main lighting, that is, fluorescent lamps.

In WO 2010/134352 A1 (Patent Literature 1), a method is proposed for obtaining a high performance white element by stacking a first light-emitting unit which causes the TTF phenomenon and a second light-emitting unit. The method is proposed as a highly effective method for realizing a white organic electroluminescent element having high efficiency and long life in comparison with a conventional white element in which a first light-emitting unit (causes no TTF phenomenon) and a second-emitting unit are stacked. However, a method for improving color rendering properties which is important for a light source for lighting applications is not referred to.

For lighting purposes, light sources that emit light with various color temperatures are required. Therefore, organic electroluminescent elements having different color temperatures have been developed. However, to produce the organic electroluminescent elements with different color temperatures used for lighting, it is necessary to change light-emitting materials and significantly change the device structure, for example. Particularly in a multiunit structure including the first light-emitting unit and the second light-emitting unit which are stacked, efficiencies of the respective units are likely to be unbalanced. Hence, it is difficult to realize emission of light with various color temperatures while keeping high efficiency and life property, unless the material is changed or the structure is significantly changed.

CITATION LIST

Patent Literature

Patent Literature 1: WO2010/134352 A1

SUMMARY OF INVENTION

Technical Problem

In view of the above insufficiency, the present invention has aimed to propose an organic electroluminescent element which can be configured, by making a minor change in a configuration (e.g., adjusting a thickness), to emit white light with a color temperature in a range of a low color temperature to a high color temperature that is an important factor for a light source used in lighting applications, yet the organic electroluminescent element has a high color rendering property and especially has a high average color rendering index Ra and a high special color rendering index R9 for red while being highly efficient and long life.

Solution to Problem

An organic electroluminescent element in accordance with the present invention includes: a transparent electrode; and a first light-emitting unit including a blue fluorescent light-emitting layer and a green fluorescent light-emitting layer; and an intermediate layer; and a second light-emitting unit including a red phosphorescent light-emitting layer and a green phosphorescent light-emitting layer; and a reflecting electrode. In the organic electroluminescent element, the first light-emitting unit and the second light-emitting unit are stacked and the intermediate layer is interposed between the first light-emitting unit and the second light-emitting unit. In the organic electroluminescent element, the first light-emitting unit is designed to emit light by use of a phenomenon that a singlet exciton is generated by collision and fusion of two triplet excitons.

In the organic electroluminescent element, it is preferable that the green fluorescent light-emitting layer contains a green fluorescent light-emitting material and the green fluorescent light-emitting material has a maximum emission wavelength between 460 nm and 540 nm and the green phosphorescent light-emitting layer contains a green phosphorescent light-emitting material and the green phosphorescent light-emitting material has a maximum emission wavelength between 540 nm and 610 nm.

In the organic electroluminescent element, it is preferable that a difference between the maximum emission wavelength of the green fluorescent light-emitting layer and the maximum emission wavelength of the green phosphorescent light-emitting layer is 35 nm or more.

In the organic electroluminescent element, it is preferable that the blue fluorescent light-emitting layer contains a blue fluorescent light-emitting material and the blue fluorescent light-emitting material has a maximum emission wavelength of 460 nm or less.

In the organic electroluminescent element, it is preferable that the red phosphorescent light-emitting layer contains a red phosphorescent light-emitting material and the red phosphorescent light-emitting material has a maximum emission wavelength of 610 nm or more In the organic electroluminescent element, it is preferable that the first light-emitting unit is disposed close to the transparent electrode and the second light-emitting unit is disposed close to the reflecting electrode.

Advantageous Effects of Invention

According to the present invention, white light is obtained in a range of from low color temperature to high color temperature that is important to an illumination light source with a minor design change such as adjustment of a film thickness. Moreover, the organic electroluminescent element has high color rendering property especially in an average color rendering index Ra and a special color rendering index R9 for red, while being highly efficient and long life.

DESCRIPTION OF EMBODIMENTS

Hereinafter, embodiments of the present invention will be described.

Figure 1:
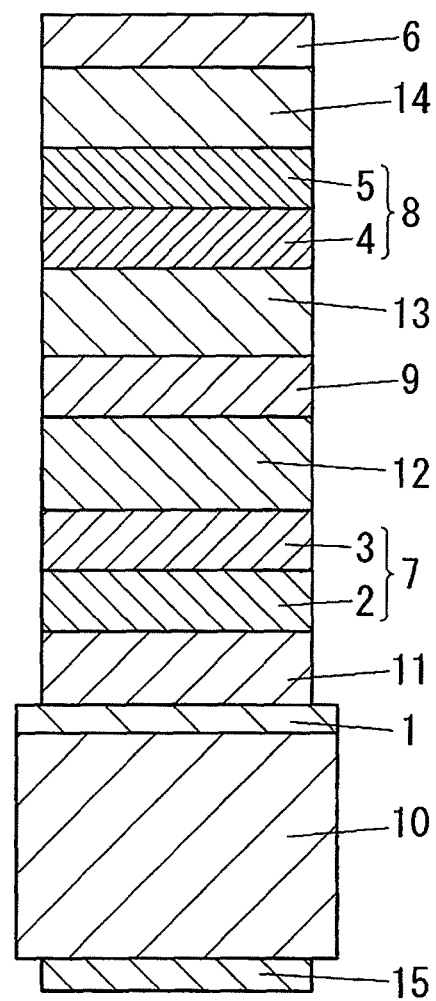
FIG. 1 is a sectional view showing an overview of a layer structure of an organic electroluminescent element.

An example of the structure of an organic electroluminescent element according to the present invention is shown in FIG. 1. This organic electroluminescent element is formed by forming a transparent electrode 1 on the surface of a substrate 10, and providing a first hole transporting layer 11, a blue fluorescent light-emitting layer 2, a green fluorescent light-emitting layer 3, a first electron transporting layer 12, an intermediate layer 9, a second hole transporting layer 13, a red phosphorescent light-emitting layer 4, a green phosphorescent light-emitting layer 5, a second electron transporting layer 14 and a reflecting electrode 6 on the transparent electrode 1 in this order. A light extracting layer 15 is further formed on the opposite surface of the substrate 10 to the transparent electrode 1. Hereinafter, embodiments will be described using this structure as an example, but this structure is merely an example, and the present invention is not limited to this structure within the intent of the present invention.

It is preferable that the substrate 10 has optical transparency. The substrate 10 may be colorless and transparent or slightly colored. The substrate 10 may have a frosted glass appearance. Examples of materials for the substrate 10 include transparent glass such as soda-lime glass and alkali-free glass, and plastic such as polyester resin, polyolefin resin, polyamide resin, epoxy resin, and fluorine-based resin. The shape of the substrate 10 may be a film-like shape or a plate-like shape.

The transparent electrode 1 functions as an anode. An anode in the organic electroluminescent element is an electrode for injecting holes into a light-emitting layer. A metallic oxide such as ITO (indium-tin oxide), $SnO_2$, ZnO and IZO (indium-zinc oxide), or the like is used as a material for forming the transparent electrode 1. The transparent electrode 1 may be formed using these materials by an appropriate method such as a vacuum vapor deposition method, a sputtering method, and application. A preferable thickness of the transparent electrode 1 varies depending on the materials constituting the transparent electrode 1, but the thickness may be set to 500 nm or less, and preferably in a range from 10 nm to 200 nm.

The material constituting the first hole transporting layer 11 and the second hole transporting layer 13 (hole transporting material) is appropriately selected from a group of compounds having a hole transporting property, and it is preferable that it is a compound that has a property of donating electrons and is stable when undergoing radical cationization due to electron donation. Examples of the hole transporting materials include: triarylamine-based compounds, amine compounds containing a carbazole group, amine compounds containing fluorene derivatives, and starburst amines (m-MTDATA), representative examples of which include polyaniline, 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazole biphenyl (CBP), spiro-NPD, spiro-TPD, spiro-TAD, and TNB; and 1-TMATA, 2-TNATA, p-PMTDATA, TFATA or the like as a TDATA-based material, but examples thereof are not limited to these, and any hole transporting material that is generally known is used. The first hole transporting layer 11 and the second hole transporting layer 13 can be formed by an appropriate method such as a vapor deposition method.

It is preferable that the material for forming the first electron transporting layer 12 and the second electron transporting layer 14 (electron transporting material) is a compound that has the ability to transport electrons, can accept electrons injected from the reflecting electrode 6, and exhibits excellent electron injection effects on the light-emitting layers, and moreover, prevents the movement of holes to the first electron transporting layer 12 and the second electron transporting layer 14 and is excellent in terms of thin film formability. Examples of the electron transporting materials include Alq3, oxadiazole derivatives, starburst oxadiazole, triazole derivatives, phenylquinoxaline derivatives, and silole derivatives. Specific examples of the electron transporting materials include fluorene, bathophenanthroline, bathocuproine, anthraquinodimethane, diphenoquinone, oxazole, oxadiazole, triazole, imidazole, anthraquinodimethane, 4,4'-N,N'-dicarbazole biphenyl (CBP), etc., and compounds thereof, metal-complex compounds, and nitrogen-containing five-membered ring derivatives. Specifically, examples of metal-complex compounds include tris(8-hydroxyquinolinato)aluminum, tri(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)(o-cresolate)gallium, bis(2-methyl-8-quinolinato)(1-naphtholate)aluminum, and bis(2-methy-8-quinolinato)-4-phenylphenolato, but are not limited thereto. Preferable examples of nitrogen-containing five-membered ring derivatives include oxazole, thiazole, oxadiazole, thiadiazole, and triazole derivatives, and specific examples thereof include 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4"-biphenyl)1,3,4-oxadiazole, 2,5-bis(1-naphthyl)-1,3,4-oxadiazole, 1,4-bis[2-(5-phenylthiadiazolyl)]benzene, 2,5-bis(1-naphthyl)-1,3,4-triazole, and 3-(4-biphenylyl)-4-phenyl-5-(4-t-butylphenyl)-1,2,4-triazole, but are not limited thereto. Examples of the electron transporting materials include the polymer materials used for a polymer organic electroluminescent element. Examples of these polymer materials include polyparaphenylene and derivatives thereof, and fluorene and derivatives thereof. There is no particular limitation on the thickness of the first electron transporting layer 12 and the second electron transporting layer 14, and for example, it is formed to have a thickness in the range of 10 nm to 300 nm. The first electron transporting layer 12 and the second electron transporting layer 14 can be formed by an appropriate method such as a vapor deposition method.

The reflecting electrode 6 functions as a cathode. A cathode in the organic electroluminescent element is an electrode for injecting electrons into a light-emitting layer. It is preferable that the reflecting electrode 6 is formed of a material having a small work function, such as a metal, an alloy, an electric conductive compound, and a mixture of these. Examples of materials for forming the reflecting electrode 6 include Al, Ag, and MgAg. The reflecting electrode 6 may be formed of an $Al/Al_2O_3$ mixture, and suchlike. The reflecting electrode 6 may be formed using these materials by an appropriate method such as a vacuum vapor deposition method and a sputtering method. A preferable thickness of the reflecting electrode 6 varies depending on the materials constituting the reflecting electrode 6, but the thickness may be set to 500 nm or less, and preferably in the range from 20 nm to 200 nm.

The light extracting layer 15 can be formed by stacking light-scattering films or microlens films on the surface of the substrate 10 on the opposite side to the transparent electrode 1 to improve a light diffusion property.

Then, in the organic electroluminescent element according to the present invention, as described below, color rendering properties can be improved by combining a plurality of light-emitting materials having appropriate maximum emission wavelengths (emission peak wavelengths).

Each light-emitting layer (the blue fluorescent light-emitting layer 2, the green fluorescent light-emitting layer 3, the red phosphorescent light-emitting layer 4 and the green phosphorescent light-emitting layer 5) may be formed of an organic material (host material) doped with a light-emitting material (dopant).

Any of an electron transporting material, a hole transporting material, and a material having both of electron transporting property and hole transporting property may be used as the host material. An electron transporting material and a hole transporting material may be used in combination as the host material.

The blue fluorescent light-emitting material contained in the blue fluorescent light-emitting layer 2 is not particularly limited as long as it enables high emission efficiency by use of TTF phenomenon, and any fluorescent light-emitting material can be used. It is preferable that the blue fluorescent light-emitting material has a maximum emission wavelength of 460 nm or less (lower limit of about 430 nm). Such a short wavelength blue fluorescent light-emitting material having a maximum emission wavelength of 460 nm or less enables a white organic electroluminescent element to be high performance and have a high average color rendering index Ra.

Examples of host materials constituting the blue fluorescent light-emitting layer 2 include TBADN (2-t-butyl-9,10-di(2-naphthyl)anthracene), AND, and BDAF. It is preferable that the concentration of the blue fluorescent light-emitting material is in the range from 1% by mass to 30% by mass.

Figure 2:
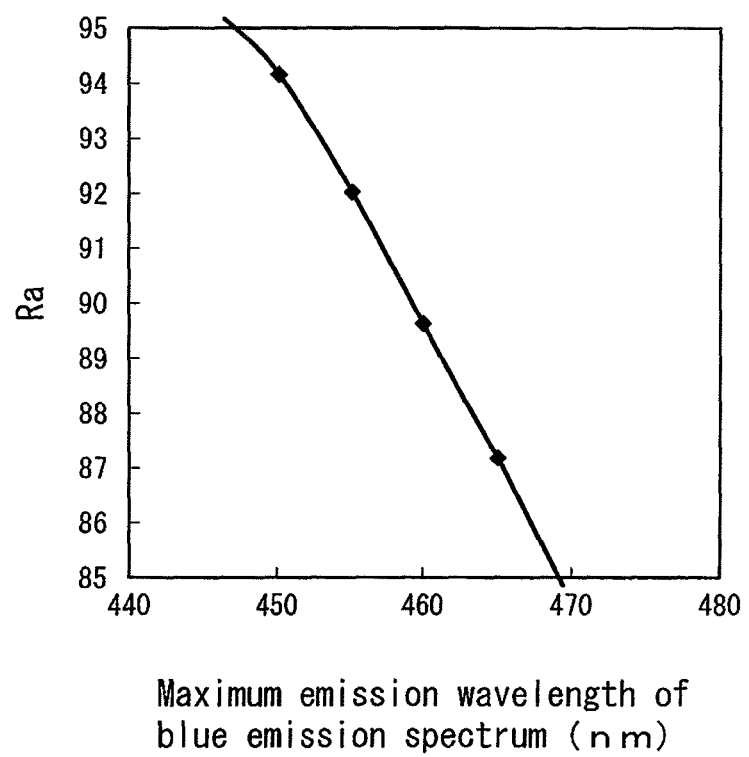
FIG. 2 is a graph showing the relation between the maximum emission wavelength of a blue emission spectrum and an average color rendering index Ra of the organic electroluminescent element.

FIG. 2 shows calculation results of an average color rendering index Ra when $Pq_2Ir(acac)$ which is a red phosphorescent light-emitting material and $Ir(ppy)_3$ which is a green light-emitting material are used and the emission spectrum of TBP (1-tert-butyl-perylene) which is a blue fluorescent light-emitting material is shifted from 445 nm to 470 nm. As is obvious from FIG. 2, it is important to shorten the wavelength of the blue emission spectrum to realize high color rendering properties, and a blue emission with a short wavelength of 460 nm or less is particularly effective to realize high color rendering properties in which the average color rendering index Ra is more than 90 (the average color rendering index Ra of a bulb-shaped fluorescent lamp is 84). Similarly, in an examination of a white light-emitting device with four wavelengths (the organic electroluminescent elements of Examples 1 to 3 described below) in which TPA having a maximum emission wavelength at 530 nm, $Bt_2Ir(acac)$ having a maximum emission wavelength at 566 nm and $Ir(piq)_3$ having a maximum emission wavelength at 629 nm are used and BCzVBi is used as a blue fluorescent light-emitting material, it was confirmed that color rendering properties improve as the wavelength of the blue emission spectrum shortens, and it is possible to realize high color rendering properties in which the average color rendering index Ra is more than 90 in a region where the maximum emission wavelength is 460 nm or less. Color rendering properties depend on the shape of the spectrum, and the above is an example. If a light-emitting material having a general emission spectrum (a half width of the spectrum of about 40 to 80 nm) is used, the maximum emission wavelength greatly affects color rendering properties, and it can be said that shortening a maximum emission wavelength of a blue fluorescent light-emitting material is effective in improving color rendering properties.

The green fluorescent light-emitting material contained in the green fluorescent light-emitting layer 3 is not particularly limited and any fluorescent light-emitting material can be used. It is preferable that the maximum emission wavelength of the green fluorescent light-emitting material is shorter than the maximum emission wavelength of the green phosphorescent light-emitting material in consideration of the life property. Concretely, it is preferable that the maximum emission wavelength of the green fluorescent light-emitting material is present between 460 nm to 540 nm. The emission spectrum of the green fluorescent light-emitting material can cover the region between the emission spectrum of the blue fluorescent light-emitting material and the emission spectrum of the green phosphorescent light-emitting material by using the green fluorescent light-emitting material having the maximum emission wavelength in this region, and thus it is possible to further improve color rendering properties.

Examples of host materials constituting the green fluorescent light-emitting layer 3 include Alq3 (tris-(8-oxoquinoline)aluminium (III)), AND, and BDAF. It is preferable that the concentration of the green fluorescent light-emitting material is in the range from 1% by mass to 20% by mass.

The green phosphorescent light-emitting material contained in the green phosphorescent light-emitting layer 5 is not particularly limited and any phosphorescent light-emitting material can be used. It is preferable that the maximum emission wavelength of the green phosphorescent light-emitting material is longer than the maximum emission wavelength of the green fluorescent light-emitting material in consideration of the life property. Concretely, it is preferable that the maximum emission wavelength of the green phosphorescent light-emitting material is present between 540 nm and 610 nm. The emission spectrum of the green phosphorescent light-emitting material can cover the region between the emission spectrum of the green fluorescent light-emitting material and the emission spectrum of the red phosphorescent light-emitting material by using a green phosphorescent light-emitting material having a maximum emission wavelength in this region, and it is possible to further improve color rendering properties.

Examples of host materials constituting the green phosphorescent light-emitting layer 5 include CBP (4,4'-N,N'-dicarbazole-biphenyl). CzTT, TCTA, mCP, and CDBP. It is preferable that the concentration of the green phosphorescent light-emitting material is in the range from 1% by mass to 40% by mass.

As described above, it is possible to adjust emission color effectively and facilitate improving efficiency and color rendering properties by using two kinds of green light-emitting materials (green fluorescent light-emitting material and green phosphorescent light-emitting material), which have different maximum emission wavelength regions.

Figure 3A:
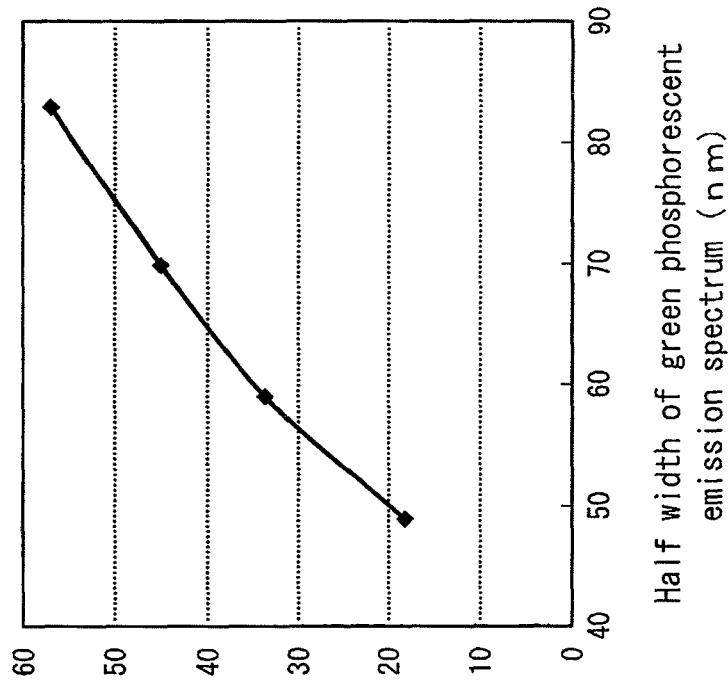
FIG. 3A is a graph showing the relation between the half width of a green phosphorescent emission spectrum and an average color rendering index Ra of the organic electroluminescent element.
Figure 3B:
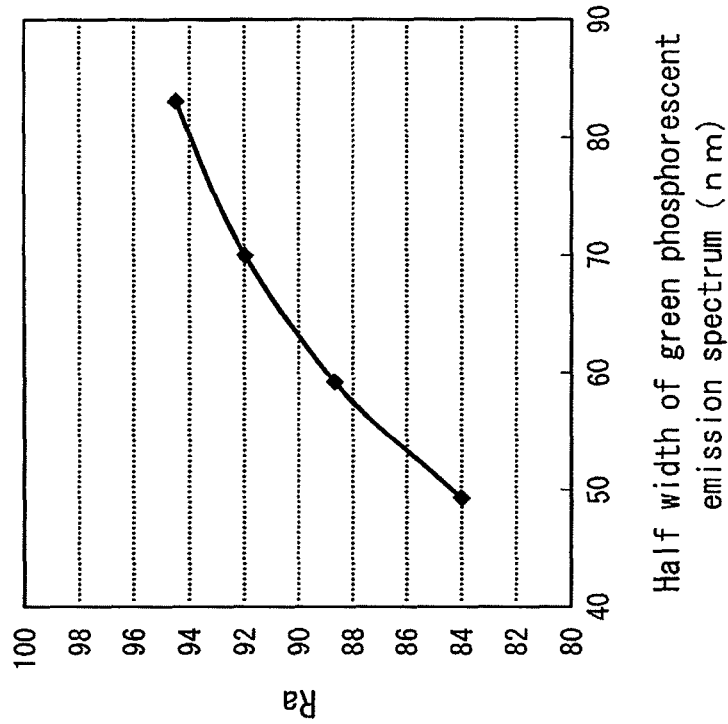
FIG. 3B is a graph showing the relation between the half width of a green phosphorescent emission spectrum and a special color rendering index R9 (red) of the organic electroluminescent element.

There is no particular limitation on the half width of the emission spectrum of the green fluorescent light-emitting material and the green phosphorescent light-emitting material, but it is preferable that the half width of the emission spectrum at least one of the green fluorescent light-emitting material and the green phosphorescent light-emitting material is 60 nm or more, and it is more preferable that it is 70 nm or more (upper limit of about 120 nm). When a green light-emitting material has an emission spectrum with a large half width of 60 nm or more, the green light emitting material can appropriately cover a broad wavelength region between the blue emission spectrum with a short wavelength and the red emission spectrum with a long wavelength, and it is effective in improving color rendering properties. Of course, if the half widths of the spectra of both the green fluorescent light-emitting material and the green phosphorescent light-emitting material are 60 nm or more, it is more effective in improving color rendering properties. FIG. 3 is a graph showing the relation between the half width of the emission spectrum of the green phosphorescent light-emitting material (green phosphorescent emission spectrum) and the average color rendering index Ra or the special color rendering index R9 (red) when the half width of the green phosphorescent emission spectrum is varied from 50 nm to 83 nm while a blue fluorescent light-emitting material, a green fluorescent light-emitting material, and a red phosphorescent light-emitting material are not changed. As is obvious from FIG. 3, high color rendering properties can be obtained in both the average color rendering index Ra and the special color rendering index R9 (red) when the half width of the green phosphorescent emission spectrum is 60 nm or more. Color rendering properties depend on the shape of the spectrum, and the above is an example. The half width of the green emission spectrum greatly affects color rendering properties, and it can be said that increasing in the half width of the green emission spectrum is effective in improving color rendering properties.

Figure 4A:
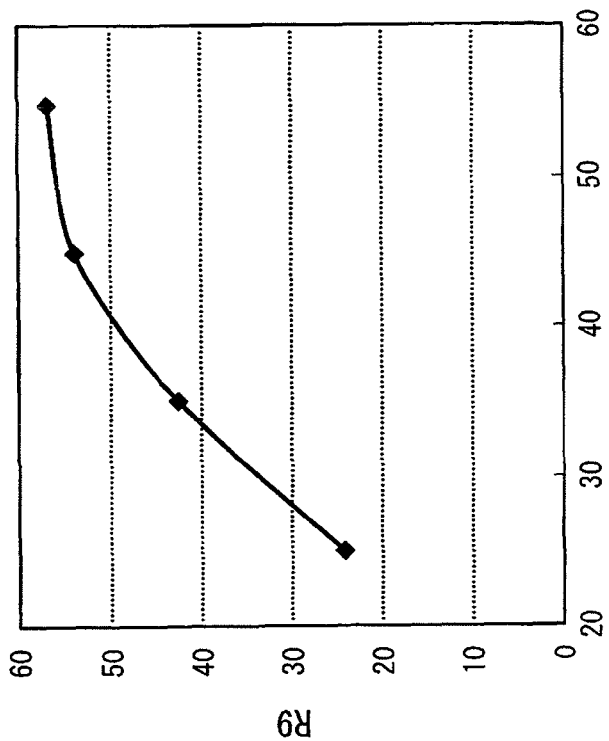
FIG. 4A is a graph showing the relation between the difference of a maximum emission wavelength of a green fluorescent light-emitting material from a maximum emission wavelength of a green phosphorescent light-emitting material and an average color rendering index Ra.
Figure 4B:
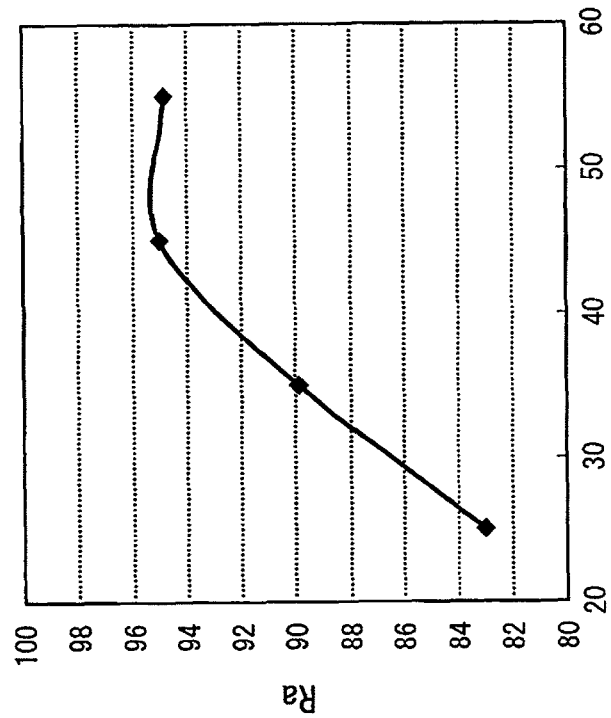
FIG. 4B is a graph showing the relation between the difference of a maximum emission wavelength of a green fluorescent light-emitting material from a maximum emission wavelength of a green phosphorescent light-emitting material and a special color rendering index R9 (red)

There is no particular limitation on the difference between the maximum emission wavelength of the green fluorescent light-emitting material and the maximum emission wavelength of the green phosphorescent light-emitting material, but it is preferable that it is 35 nm or more, and it is more preferable that it is 40 nm or more (upper limit of about 100 nm). Wavelength regions covered by each green emission spectrum can be distinct from each other when green light-emitting materials are used in which the difference between their maximum emission wavelengths is 35 nm or more, and it is possible to adjust emission color efficiently and further improve efficiency and color rendering properties. FIG. 4 is a graph showing the relation between the difference of the maximum emission wavelength of the green fluorescent light-emitting material from the maximum emission wavelength of the green phosphorescent light-emitting material (the difference between maximum emission wavelengths of the green light-emitting materials) and the average color rendering index Ra or the special color rendering index R9 (red). As is obvious from FIG. 4, if the difference between the maximum emission wavelength of the green fluorescent light-emitting material and the maximum emission wavelength of the green phosphorescent light-emitting material is 35 nm or more, high color rendering properties can be obtained in both the average color rendering index Ra and the special color rendering index R9 (red). Color rendering properties depend on the shape of the spectrum, and the above is an example. Color rendering properties are greatly affected by the difference between the maximum emission wavelength of the green fluorescent light-emitting material and the maximum emission wavelength of the green phosphorescent light-emitting material, and it can be said that increasing in this difference between maximum emission wavelengths is effective in improving color rendering properties.

Figure 5:
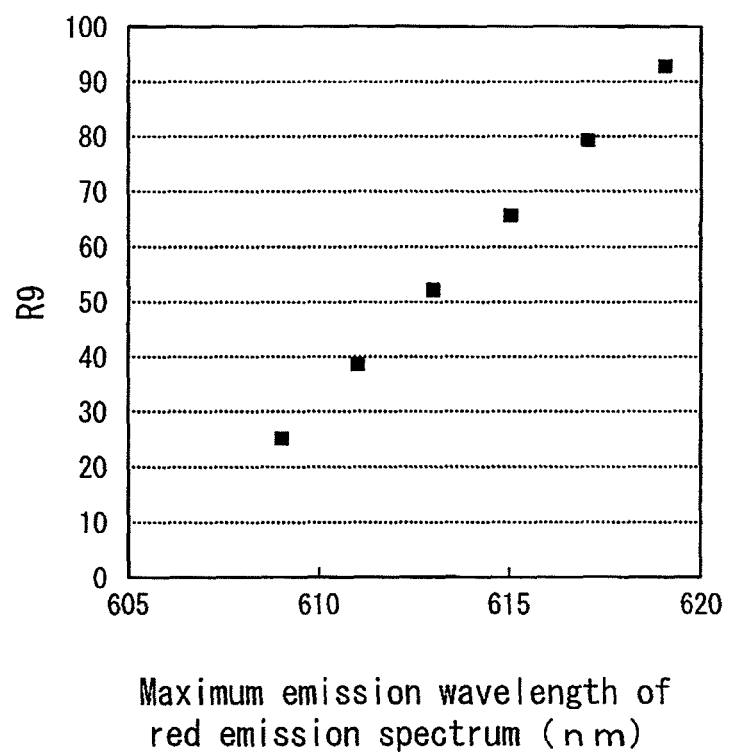
FIG. 5 is a graph showing the relation between a maximum emission wavelength of a red emission spectrum and a special color rendering index R9 (red) of the organic electroluminescent element.

The red phosphorescent light-emitting material contained in the red phosphorescent light-emitting layer 4 is not particularly limited and any phosphorescent light-emitting material can be used. It is preferable that the maximum emission wavelength of the red phosphorescent light-emitting material is 610 nm or more (upper limit of about 640 nm) to improve color rendering properties. Such a long wavelength red phosphorescent light-emitting material having a maximum emission wavelength of 610 nm or more enables a white organic electroluminescent element to be high performance and have a high special average color rendering index R9 (red). FIG. 5 is a graph showing the relation between the maximum emission wavelength of the red phosphorescent light-emitting material and the special color rendering index R9 (red). Namely, the graph shows calculation results of the special color rendering index R9 (red) when BCzVBi which is a blue fluorescent light-emitting material, TPA which is a green fluorescent light-emitting material and $Bt_2Ir(acac)$ which is a green phosphorescent light-emitting material are used and an emission spectrum of $Ir(piq)_3$ which is a red phosphorescent light-emitting material is shifted. As is obvious from FIG. 5, increasing in the wavelength of the maximum emission wavelength of the red emission spectrum is effective in improving the special color rendering index R9 (red) and, particularly, increasing in the wavelength to 610 nm or more is important to improve color rendering properties in which the special color rendering index R9 (red) is more than 30 (the special color rendering index R9 (red) of a bulb-shaped fluorescent lamp is about 25).

Examples of host materials constituting the red phosphorescent light-emitting layer 4 include CBP (4,4'-N,N'-dicarbazole-biphenyl), CzTT, TCTA, mCP, and CDBP. It is preferable that the concentration of the red phosphorescent light-emitting material is in the range from 1% by mass to 40% by mass.

Each light-emitting layer (the blue fluorescent light-emitting layer 2, the green fluorescent light-emitting layer 3, the red phosphorescent light-emitting layer 4, and the green phosphorescent light-emitting layer 5) may be formed by appropriate methods including a dry process (e.g., a vacuum vapor deposition and transfer) and a wet process (e.g., spin coating, spray coating, die coating, and gravure printing).

In the organic electroluminescent element according to the present invention, the first light-emitting unit 7 and a second light-emitting unit 8 are stacked such that an intermediate layer 9 is interposed between them, so that a multiunit structure is formed as shown in FIG. 1.

The first light-emitting unit 7 includes the blue fluorescent light-emitting layer 2 and the green fluorescent light-emitting layer 3 which are stacked, and both the blue fluorescent light-emitting layer 2 and the green fluorescent light-emitting layer 3 contain fluorescent light-emitting materials.

In the present invention, the first light-emitting unit 7 is designed to emit light by use of a phenomenon (TTF: triplet-triplet fusion) that a singlet exciton is generated by collision and fusion of two triplet excitons. The first light-emitting unit 7 using the TTF phenomenon is made of the aforementioned blue fluorescent light-emitting material and green fluorescent light-emitting material. Utilizing the TTF phenomenon as mentioned above can improve the efficiency of the first light-emitting unit 7. Moreover, with combining the first light-emitting unit 7 with the second light-emitting unit 8, the high efficient white element can be obtained. Provided that the first light-emitting unit 7 has the aforementioned structure that layers having different emission colors are stacked, it is possible to adjust the color temperature of emitted light yet the efficiency is kept high. For example, in another case that the first light-emitting unit 7 is a monochromatic light-emitting layer consisting of the blue fluorescent light-emitting layer 2 alone, the intensity of the blue emission is excessively high. Hence, it is impossible to produce a white element having a low color temperature. In the embodiment of the present invention in which the blue fluorescent light-emitting layer 2 and the green fluorescent light-emitting layer 3 are stacked, to produce white light with a relatively high color temperature, the film thickness of the blue fluorescent light-emitting layer 2 is increased to increase a rate of the intensity of the blue emission. Meanwhile, to produce white light with a relatively low color temperature, the film thickness of the green fluorescent light-emitting layer 3 is increased to increase a rate of the intensity of the green emission. Hence, it is possible to facilitate adjustment of emission color without causing a decrease in the efficiency. In the present invention, the first light-emitting unit 7 using the TTF phenomenon is not limited to particular one as long as the first light-emitting unit 7 employs the TTF phenomenon. In a preferred instance, the first light-emitting unit 7 has an internal quantum efficiency of 25% or more. According to this preferred instance, the organic electroluminescent element can have both the high efficiency and the long life. To cause and utilize the TTF phenomenon effectively, it is preferable that the triplet energy level of the electron transporting material for the first electron transporting layer 12 is higher than the triplet energy level of a material contained in the first light-emitting unit 7.

The phosphorescent light-emitting unit 8 includes the green phosphorescent light-emitting layer 5 and the red phosphorescent light-emitting layer 4 which are stacked, and both the green phosphorescent light-emitting layer 5 and the red phosphorescent light-emitting layer 4 contain phosphorescent light-emitting materials.

The intermediate layer 9 serves the function of electrically connecting two light-emitting units in series. It is preferable that the intermediate layer 9 has high transparency and is highly thermally and electrically stable. The intermediate layer 9 can be formed of a layer that forms an equipotential surface, a charge generation layer, or the like. Examples of the materials for a layer that forms an equipotential surface or a charge generation layer include: a thin film of metal such as Ag, Au, or Al; metal oxides such as vanadium oxide, molybdenum oxide, rhenium oxide, and tungsten oxide; a transparent conductive film such as ITO, IZO, AZO, GZO, ATO, and $SnO_2$; a so-called laminate of an n-type semiconductor and a p-type semiconductor; a laminate of a metal thin film or transparent conductive film, and either one of or both an n-type semiconductor and a p-type semiconductor; a mixture of an n-type semiconductor and a p-type semiconductor; and a mixture of a metal and either one of or both an n-type semiconductor and a p-type semiconductor. There is no particular limitation on the n-type semiconductor and the p-type semiconductor, and any semiconductors selected as necessary are used. The n-type semiconductor and the p-type semiconductor may be formed of either an inorganic material or an organic material. The n-type semiconductor and the p-type semiconductor may be a mixture of an organic material and a metal; a combination of an organic material and a metal oxide; or a combination of an organic material and an organic acceptor/donor material or inorganic acceptor/donor material. The intermediate layer 9 can be formed of BCP:Li, ITO, $NPD:MoO_3$, Liq:Al, or the like. BCP indicates 2,9-dimethyl-4,7-diphenyl-1,10-phenanthroline. For example, the intermediate layer 9 can have a two-layered configuration obtained by disposing a first layer made of BCP:Li close to the anode, and a second layer made of ITO close to the cathode side. It is preferable that the intermediate layer 9 has a layer structure such as $Alq3/Li_2O$/HAT-CNG, $Alq3/Li_2O$, or $Alq3/Li_2O$/Alq3/HAT-CN6.

A demand of the materials for improving the performance of the first light-emitting unit 7 and a demand of the materials for improving the performance of the second light-emitting unit 8 differ in the physical properties of the materials such as ionization potential, electron affinity and triplet energy level. Therefore, it is possible to select materials for each unit by disposing the intermediate layer 9 so that the first light-emitting unit 7 and the phosphorescent light-emitting unit 8 are separated by the intermediate layer 9. This separation of the first light-emitting unit 7 and the second light-emitting unit 8 is effective in realizing high efficiency and long life. Furthermore, a multiunit structure in which the first light-emitting unit 7 having an emission spectrum in the region of a relatively short wavelength and the second light-emitting unit 8 having an emission spectrum in the region of a relatively long wavelength can be arranged separately owing the interposed intermediate layer 9 makes optical design facilitated. The facilitated optical design can realize high efficiency, long life, high luminance, a reduced viewing angle dependency of chromaticity and the like as well as improved color rendering properties.

Furthermore, in view of improving efficiency and suppressing the viewing angle dependency of chromaticity, it is preferable that the first light-emitting unit 7 is disposed close to the transparent electrode 1 and the second light-emitting unit 8 is disposed close to the reflecting electrode 6 as shown in FIG. 1. Loss due to interference is less for a light-emitting unit disposed close to the reflecting electrode 6 than for a light-emitting unit disposed close to the transparent electrode 1, and the light extraction efficiency of the light-emitting unit disposed close to the reflecting electrode 6 tends to be higher than the light extraction efficiency of the light-emitting unit disposed close to the transparent electrode 1. Therefore, it is possible to improve performance, color rendering properties and efficiency by disposing the second light-emitting unit 8 with a high internal quantum efficiency close to the reflecting electrode 6 where the light extraction efficiency is relatively high.

As described above, the organic electroluminescent element in accordance with the present invention includes a combination of the first light-emitting unit 7 and the second light emitting unit 8. The first light-emitting unit 7 employs the TTF phenomenon and includes the blue fluorescent light-emitting layer 2 and the green fluorescent light-emitting layer 3. The second light-emitting unit 8 includes the red phosphorescent light-emitting layer 4 and the green phosphorescent light-emitting layer 5. The first light-emitting unit 7 and the second light-emitting unit 8 are stacked while the intermediate layer is interposed therebetween. Therefore, it is possible to easily obtain emission with various color temperatures, adjust emission color effectively, and improve color rendering properties, efficiency, and lifetime.

EXAMPLES

Hereinafter, the present invention will be specifically described by way of examples.

Example 1

An organic electroluminescent element having a multiunit structure as shown in FIG. 1 was prepared. Specifically, a transparent electrode 1 was formed by depositing ITO with a thickness of 130 nm on a substrate 10 (a glass substrate). A first hole transporting layer 11, a blue fluorescent light-emitting layer 2 (containing $BC_zVBi$ as a blue fluorescent light-emitting material), a green fluorescent light-emitting layer 3 (containing TPA as a green fluorescent light-emitting material) and a first electron transporting layer 12 (CBP) were further formed by a vapor deposition method with a thickness between 5 nm and 60 nm on the transparent electrode 1 in this order. Next, an intermediate layer 9 having a layer structure of $Alq3/Li_2O/Alq3/HAT-CN6$ was stacked with a layer thickness of 15 nm. Then, a second hole transporting layer 13, a red phosphorescent light-emitting layer 4 (containing $Ir(piq)_3$ as a red phosphorescent light-emitting material), a green phosphorescent light-emitting layer 5 (containing $Bt_2Ir(acac)$ as a green phosphorescent light-emitting material) and a second electron transporting layer 14 were formed with a maximum film thickness of each layer of 50 nm in this order. Subsequently, a reflecting electrode 6 made of an Al film was sequentially formed. Note that light-scattering film was stacked on the opposite surface of the substrate 10 to the transparent electrode 1 to form the light extracting layer 15.

The organic electroluminescent element obtained in a manner described above employs TTF phenomenon in the first light-emitting unit 7 which includes the blue fluorescent light-emitting layer 2 and the green fluorescent light-emitting layer 3. The blue fluorescent light-emitting layer 2 has a film thickness of 10 nm, and the green fluorescent light-emitting layer 3 has a film thickness of 20 nm, and the green phosphorescent light-emitting layer 5 has a film thickness of 10 nm, and the red phosphorescent light-emitting layer 4 has a film thickness of 10 nm. White light having a color temperature of 3000 K is obtained.

Example 2

An organic electroluminescent element was prepared in the same manner as in Example 1, except that the film thickness of the blue fluorescent light-emitting layer 2 was set to 15 nm, the film thickness of the green fluorescent light-emitting layer 3 was set to 15 nm, the film thickness of the green phosphorescent light-emitting layer 5 was set to 15 nm, and the film thickness of the red phosphorescent light-emitting layer 4 was set to 15 nm. White light having a color temperature of 4000 K is obtained.

Example 3

An organic electroluminescent element was prepared in the same manner as in Example 1, except that the film thickness of the blue fluorescent light-emitting layer 2 was set to 25 nm, the film thickness of the green fluorescent light-emitting layer 3 was set to 5 nm, the film thickness of the green phosphorescent light-emitting layer 5 was set to 0.30 nm, and the film thickness of the red phosphorescent light-emitting layer 4 was set to 10 nm. As a result, white light having a color temperature of 5000 K is obtained.

Comparative Example 1

An organic electroluminescent element was prepared in the same manner as in Example 1, except that the film thickness of the blue fluorescent light-emitting layer 2 was set to 30 nm, the film thickness of the green phosphorescent light-emitting layer 5 was set to 30 nm, and the film thickness of the red phosphorescent light-emitting layer 4 was set to 10 nm with the green fluorescent light-emitting layer 3 being not formed. This device cannot emit light in the white region since the intensity of the blue emission is excessively high.

Comparative Example 2

An organic electroluminescent element was prepared in the same manner as in Example 1, except that the first light-emitting unit 7 which did not employ TTF phenomenon was formed by using materials (Alq3) with low triplet levels as an electron transporting material for the first electron transporting layer 12 and that a light-emitting efficiency of the second light-emitting unit 8 was adjusted by adjusting the concentration of the light-emitting material for the second light-emitting unit. As a result, white light having a color temperature of 3000 K is obtained. Note that, in adjustment of the light-emitting efficiency (luminous efficacy) of the second light-emitting unit 8 by adjusting the concentration of the light-emitting material for the second light-emitting unit, to obtain white light, the light-emitting efficiency of the second light-emitting unit 8 is decreased by adjusting the concentrations of the green phosphorescent light-emitting material and the red phosphorescent light-emitting material.

Comparative Example 3

An organic electroluminescent element was prepared in the same manner as in Example 2, except that the first light-emitting unit 7 which did not employ TTF phenomenon was formed by using materials (Alq3) with low triplet energy levels as an electron transporting material for the first electron transporting layer 12 and that the light-emitting efficiency of the second light-emitting unit 8 was adjusted by adjusting the concentration of the light-emitting material for the second light-emitting unit 8. As a result, white light having a color temperature of 4000 K is obtained.

Comparative Example 4

An organic electroluminescent element was prepared in the same manner as in Example 3, except that the first light-emitting unit 7 which did not employ TTF phenomenon was formed by using materials (Alq3) with low triplet energy levels as an electron transporting material for the first electron transporting layer 12 and that the light-emitting efficiency of the second light-emitting unit 8 was adjusted by adjusting the concentration of the light-emitting material for the second light-emitting unit 8. As a result, white light having a color temperature of 5000 K is obtained.

Table 1 shows the efficiencies, the average color rendering indexes Ra, and the special color rendering indexes R9 (Red) of the organic electroluminescent elements obtained in Example 1 to 3 and Comparative Example 1 to 3.

In each of the organic electroluminescent elements in Examples 1 to 3 which employ the TTF phenomenon in the first light-emitting unit 7, it is possible to facilitate adjustment of the color temperature by adjusting film thickness of each light-emitting layer and further improve the efficiency and the color rendering property simultaneously.

On the other hand, with regard to each of the organic electroluminescent elements of Comparative Examples 1 to 4, since the TTF phenomenon is not employed, a decrease in the efficiency of the second light-emitting unit 8 is necessary for achieving the adjustment of the emission color. Hence, these white elements have the lowered efficiency.

TABLE 1

| | Color temperature Chromaticity(x, y) | Blue fluorescent light-emitting material (Film thickness) | Green fluorescent light-emitting material (Film thickness) | Green phosphorescent light-emitting material (film thickness) | Red phosphorescent light-emitting material (film thickness) | luminous efficacy | color rendering properties Ra, R9 |
|---|---|---|---|---|---|---|---|
| Example 1 | 3000K (0.43, 0.41) | BCzVBi (10 nm) | TPA (20 nm) | $Bt_2Ir(acac)$ (10 nm) | $Ir(piq)_3$ (30 nm) | 29 lm/W | 95, 63 |
| Example 2 | 4000K (0.38, 0.37) | BCzVBi (15 nm) | TPA (15 nm) | $Bt_2Ir(acac)$ (20 nm) | $Ir(piq)_3$ (20 nm) | 28 lm/W | 94, 70 |
| Example 3 | 5000K (0.34, 0.36) | BCzVBi (25 nm) | TPA (5 nm) | $Bt_2Ir(acac)$ (30 nm) | $Ir(piq)_3$ (10 nm) | 28 lm/W | 93, 68 |
| Comparative Example 1 | out of white region (0.40, 0.43) | BCzVBi (30 nm) | — | $Bt_2Ir(acac)$ (30 nm) | $Ir(piq)_3$ (10 nm) | 25 lm/W | 79, 60 |
| Comparative Example 2 | 3000K (0.43, 0.41) | BCzVBi (10 nm) | TPA (20 nm) | $Bt_2Ir(acac)$ (10 nm) | $Ir(piq)_3$ (30 nm) | 23 lm/W | 94, 63 |
| Comparative Example 3 | 4000K (0.38, 0.37) | BCzVBi (15 nm) | TPA (15 nm) | $Bt_2Ir(acac)$ (20 nm) | $Ir(piq)_3$ (20 nm) | 22 lm/W | 92, 68 |
| Comparative Example 4 | 5000K (0.34, 0.36) | BCzVBi (25 nm) | TPA (5 nm) | $Bt_2Ir(acac)$ (30 nm) | $Ir(piq)_3$ (10 nm) | 22 lm/W | 93, 68 |

REFERENCE SIGNS LIST

1 Transparent electrode
2 Blue fluorescent light-emitting layer
3 Green fluorescent light-emitting layer
4 Red phosphorescent light-emitting layer
5 Green phosphorescent light-emitting layer
6 Reflecting electrode
7 First light-emitting unit
8 Second light-emitting unit
9 Intermediate layer

The invention claimed is:

1. An organic electroluminescent element comprising:
a transparent electrode;
a first light-emitting unit including a blue fluorescent light-emitting layer and a green fluorescent light-emitting layer;
an intermediate layer;
a second light-emitting unit including a red phosphorescent light-emitting layer and a green phosphorescent light-emitting layer; and
a reflecting electrode,
wherein:
the first light-emitting unit and the second light-emitting unit are stacked and the intermediate layer is interposed between the first light-emitting unit and the second light-emitting unit; and
the first light-emitting unit is designed to emit light by use of a phenomenon that a singlet exciton is generated by collision and fusion of two triplet excitons.

2. The organic electroluminescent element according to claim 1, wherein:
the green fluorescent light-emitting layer contains a green fluorescent light-emitting material and the green fluorescent light-emitting material has a maximum emission wavelength between 460 nm and 540 nm;
the green phosphorescent light-emitting layer contains a green phosphorescent light-emitting material and the green phosphorescent light-emitting layer has a maximum emission wavelength between 540 nm and 610 nm.

3. The organic electroluminescent element according to claim 2, wherein
a difference between the maximum emission wavelength of the green fluorescent light-emitting layer and the maximum emission wavelength of the green phosphorescent light-emitting layer is 35 nm or more.

4. The organic electroluminescent element according to claim 1, wherein
the blue fluorescent light-emitting layer contains a blue fluorescent light-emitting material and the blue fluorescent light-emitting material has a maximum emission wavelength of 460 nm or less.

5. The organic electroluminescent element according to claim 1, wherein
the red phosphorescent light-emitting layer contains a red phosphorescent light-emitting material and the red phosphorescent light-emitting material has a maximum emission wavelength of 610 nm or more.

6. The organic electroluminescent element according to claim 5, wherein
the first light-emitting unit is disposed close to the transparent electrode and the second light-emitting unit is disposed close to the reflecting electrode.

* * * * *